(12) United States Patent
Kelly et al.

(10) Patent No.: US 7,504,690 B2
(45) Date of Patent: Mar. 17, 2009

(54) POWER SEMICONDUCTOR DEVICES

(75) Inventors: Brendan P. Kelly, Stockport (GB); Steven T. Peake, Warrington (GB); Raymond J. Grover, Manchester (GB)

(73) Assignee: NXP B.V., Eindhoven (NL)

( * ) Notice: Subject to any disclaimer, the term of this patent is extended or adjusted under 35 U.S.C. 154(b) by 405 days.

(21) Appl. No.: 10/529,731

(22) PCT Filed: Sep. 15, 2003

(86) PCT No.: PCT/IB03/04138

§ 371 (c)(1), (2), (4) Date: Mar. 30, 2005

(87) PCT Pub. No.: WO2004/032243

PCT Pub. Date: Apr. 15, 2004

(65) Prior Publication Data

US 2006/0001084 A1    Jan. 5, 2006

(30) Foreign Application Priority Data

Oct. 4, 2002 (GB) ................... 0223034.0
Dec. 18, 2002 (GB) ................... 0229528.5

(51) Int. Cl.
*H01L 29/72* (2006.01)

(52) U.S. Cl. ................ 257/328; 257/329; 257/500; 365/185.18

(58) Field of Classification Search ................ 257/328, 257/329, 500; 365/185.18
See application file for complete search history.

(56) References Cited

U.S. PATENT DOCUMENTS 6,072,215 A * 6/2000 Kawaji et al. ............... 257/334
6,518,126 B2 * 2/2003 Wu et al. ..................... 438/259
2002/0019099 A1 * 2/2002 Williams et al. ............. 438/270
2005/0269624 A1 * 12/2005 Hu et al. ..................... 257/315

OTHER PUBLICATIONS

Japanese Published Application—(05-343691), Dec. 24, 1993.*

* cited by examiner

*Primary Examiner*—Edward Wojciechowicz
(74) *Attorney, Agent, or Firm*—Peter Zawilski

(57) ABSTRACT

A vertical insulated gate field effect power transistor (3) has a plurality of parallel transistor cells (TC3) with a peripheral gate structure (G31, G2) at the boundary between each two transistor cells (TC3). The gate structure (G31, G32) comprises first (G31) and second (G32) gates isolated from each other so as to be independently operable. The first gate (G31) is a trench-gate (21, 22), and the second gate (G32) has at least an insulated planar gate portion (13, 14). Simultaneous operation of the first (G31) and second (G32) gates forms a conduction channel (23c, 23b) between source (16) and drain (12) regions of the device (3). The device (3) has on-state resistance approaching that of a trench-gate device, better switching performance than a DMOS device, and a better safe operating area than a trench-gate device. The device (3) may be a high side power transistor is series with a low side power transistor (6) in a circuit arrangement (50) (FIG. 14) for supplying a regulated output voltage. The device (3) may also be a switch in a circuit arrangement (60) (FIG. 15) for supplying current to a load (L). These circuit arrangements (50, 60) include a terminal (Vcc, $V_F$) for applying a supplied fixed potential to an electrode (G311) for the first gates (G31) and a gate driver circuit (573, 673) for applying modulating potential to an electrode (G321) for the second gates (G32).

16 Claims, 7 Drawing Sheets

POWER SEMICONDUCTOR DEVICES

The present invention relates to power semiconductor devices and to circuit arrangements including such devices.

Vertical insulated gate field effect power transistor semiconductor devices are known comprising a semiconductor body having an active area with a plurality of electrically parallel transistor cells, wherein each transistor cell has a source region and a drain region of a first conductivity type which are separated by a channel-accommodating body region of a second, opposite, conductivity type adjacent a peripheral insulated gate structure.

Two types of such known vertical insulated gate power transistor devices are shown in schematic cross-section view in FIGS. 1 and 2 of the accompanying drawings.

Referring now to FIG. 1, there is shown a known double-diffused metal-oxide-semiconductor (DMOS) form of vertical MOSFET power transistor semiconductor device 1. The device 1 comprises a monocrystalline silicon semiconductor body 10 having a top major surface 10a opposed to a bottom major surface 10b. The semiconductor body 10 comprises a relatively highly doped substrate 11 of a first conductivity type, n+ conductivity type in this example, which forms the drain region of the MOSFET. A relatively lowly doped semiconductor region 12 of the first conductivity type (n− conductivity type in this example) forms a drain drift region of the MOSFET.

The device 1 has an active area with a large number of electrically parallel transistor cells sharing the common drain region 11. FIG. 1 shows the lateral extent, that is the cell pitch, of one complete transistor cell TC1 and part of an adjacent transistor cell at either side of the cell TC1. Two sections are shown of a peripheral insulated gate structure G1 located on the top major surface 10a at the boundary between each two adjacent transistor cells. The gate structure G1 has a planar gate insulation layer 13 on the top major surface 10a with gate conductive material 14 thereon, the layer 13 and material 14 extending laterally inwards from the periphery of the cell TC1.

The drain drift region 11 extends to the top major surface 10a at a peripheral region 12a of adjacent transistor cells. Between the drain drift regions 12a of each transistor cell there is a double diffused structure consisting of a body region 15 of a second, opposite, conductivity type (p conductivity type in this example) and a source region 16 of the first conductivity type (n+ conductivity type in this example). Thus the source region 16 and the drain drift region 12a are separated by the body region 15, which is a channel-accommodating region, adjacent the lateral planar insulated gate 13, 14 of the peripheral gate structure G1. This enables a lateral conduction channel 15a to be formed in the body portion 15 when suitable gate potential is applied to the gate material 14 in the on-state of the device 1, whereby current flows in a path in each transistor cell from the source region 16 laterally through the conduction channel 15a into the peripheral drain drift region 12a and then vertically through the drain drift regions 12a and 12 to the drain region 11.

An insulating region 17 is provided over the gate structure G1. Source metallization 18 contacting all of the source regions 16 is provided on the first major surface 10a over the insulating region 17 to provide a source electrode S. Although not shown, electrical connection to the insulated gate structure G1 is provided by formation of one or more windows through the insulating region 17 to expose part of the gate conductive layer 14 and patterning of the source metallization to provide a separate gate electrode. A metallization layer 19 forms an ohmic contact with the drain region 11 so as to provide a drain electrode D.

Referring now to FIG. 2, there is shown a known trench-gate form of vertical MOSFET power transistor semiconductor device 2. The device 2 comprises a semiconductor body 10 with top and bottom major surfaces 10a, 10b, a first conductivity type drain region 11 and a first conductivity type drain drift region 12 in like manner to the device 1 of FIG. 1, except that the drain drift region 12 does not extend to the surface 10a.

FIG. 2 shows the lateral extent (the cell pitch) of one complete transistor cell TC2 and part of an adjacent transistor cell at either side of the cell TC2. Two sections are shown of a peripheral insulated gate structure G2 located in a trench 20 at the boundary between each two adjacent transistor cells. The trench-gate structure G2 extends vertically through a channel-accommodating second, opposite, conductivity type body region 23 into the drain drift region 12, and has an insulation layer 21 at the vertical and bottom walls of the trench 20 and gate conductive material 22 in the trench 20 within the layer 21. A source region 24, of the first conductivity type, is present in each transistor cell under the top major surface 10a and adjacent the trench-gate 21,22. Thus the source region 24 and the drain drift region 12 are separated by the channel-accommodating body region 23 adjacent the trench-gate 21, 22 provided by the peripheral insulated gate structure G2. This enables a vertical conduction channel 23a to be formed in the body portion 23 when a suitable gate potential is applied to the gate material 22 in the on-state of the device 2, whereby current flows in a path in each transistor cell from the source region 24 vertically through the conduction channel 23a to the drain drift region 12.

An insulating region 25 is provided over the gate structure G2. Source metallization 18 contacting all of the source regions 24 is provided on the first major surface 10a over the insulating region 25 to provide a source electrode S. Although not shown, electrical connection to the insulated gate structure G2 is provided by extending the insulating layer 21 from the trenches 20 on to the top surface 10a of the semiconductor body 10 in an inactive area outside the active transistor cell area and extending the gate material 22 on to this top surface insulating layer where it is contacted by metallization to provide a gate electrode. A metallization layer 19 forms an ohmic contact with the drain region 11 so as to provide a drain electrode D.

A desirable property of power transistors is to have a low on-state resistance. Considering the two known power transistor devices just described with reference to FIGS. 1 and 2, it is known that when both these device structures are used for low and medium voltage power transistors, that is with a drain-source breakdown voltage of up to about 200 volts, the on-state resistance of the device is to a large extent dependent on the sum total of the conducting channel peripheries. Thus for a given size of the device, that is a given active transistor cell area, a larger number of transistor cells in that active area leads to a lower on-state resistance. A limitation in this respect for the DMOS device of FIG. 1 is that if the transistor cells are packed too close together by reducing the lateral extent of the peripheral drain drift region 12a then the "Junction-FET" effect in this region will constrict the vertical current flow path down to the drain 11. The trench-gate device of FIG. 2 does not have this "Junction-FET" limitation, so that for a given size of device the trench-gate structure can have more transistor cells and a lower on-state resistance. This is illustrated by showing the cell pitch TC2 in FIG. 2 to be smaller than the cell pitch TC1 in FIG. 1.

Another desirable property for power transistors is to have good switching performance, that is fast switching and low switching losses when the device is turned on and turned off. This is particularly important where the power transistor is to be used in the output stage of a power supply, for example a voltage regulation module (VRM), where it is continuously turned on and off at very high frequency. When a DMOS device according to FIG. 1 is compared with a trench gate device according to FIG. 2, it is known that for the case where the two devices have the same on-state resistance, the DMOS device generally exhibits faster switching and lower switching losses than the trench-gate device. This derives from the geometry of the two devices wherein the depletion width through the drain drift region 12a and 12 below the gate electrode 14 in the DMOS device of FIG. 1 is much greater than the depletion width through the drain drift region 12 below the gate electrode 22 in the trench-gate device of FIG. 2. That is to say the structures are such that the depletion under the gate electrode 14 forced by the junctions with the body region 15 for the DMOS device reaches further than the depletion under the gate electrode 22 forced by the junctions with the body region 23 for the trench-gate device. Since the component of the gate-drain capacitance Cgd due to depletion is inversely proportional to the depletion width then the component of Cgd due to depletion at high drain voltage is lower for the DMOS device than for the trench-gate device. This contributes to a rapid fall in the drain voltage Vds as the device turns on because dV/dt=Ig/Cgd where Ig is constant. Thus the contribution to switching losses that occurs due to the rate of change of the drain voltage at turn on and turn off is less for the DMOS device than for the trench-gate device. An alternative way to visualize the rate of change of drain voltage at turn on and turn off for the DMOS device is to consider the "divD" effect. That is, the equipotentials are such that they "direct" the discharge current into the body rather than capacitively into the gate electrode. This means for a given rate of dV/dt the proportion of discharge current going into the gate electrode becomes smaller and for a given gate current the dV/dt is faster. Thus the discharging current component of Cgd is reduced.

Another desirable property for power transistors is to have good transfer characteristics for amplification or current regulation while the device is in the partially turned on, that is the controlling, state. This is particularly important in applications where the power transistor is to be used to supply and regulate current, when required, to a load, such as a lamp, solenoid or motor, when it is high side connected via the source electrode to the load or low side connected via the drain electrode to the load. In these applications the on-state resistance is still of major importance and, as discussed above, this is inherently less for a trench-gate device according to FIG. 2 than for a DMOS device according to FIG. 1. However, when the power transistor is used for current supply when required rather than in a high frequency switching application, the performance during the partially turned on state assumes greater importance than the switching performance.

It is of particular concern in these current supply and regulation modes that the device should have a good safe operating area. In this respect a trench-gate device according to FIG. 2 suffers from short channel effects and from current crowding, which limit its safe operating area, to a greater extent than a DMOS device according to FIG. 1. This is explained below.

The term "short channel effects" usually refers to the effective reduction in the channel length (as available through the conductive body region) as the body region depletes back in response to increasing drain potential. The effective shortening of the channel increases the output current for a constant gate voltage, in response to higher drain voltages. A trench-gate device according to FIG. 2 is particularly prone to short channel effects because the electric field from the drain drift region 12 is perpendicular to the direction of the channel 23a and acts directly to deplete the body region 23 upwards and so shorten the effective channel. By contrast in a DMOS device according to FIG. 1, the opposing body regions 15 work together to deplete the drain drift region 12a between them while the drain field is applied underneath the body 15 and parallel to the channel 15a so it has less influence on effective channel length. Also, for the trench-gate device according to FIG. 2, local processing variations, especially trench-etch depth and planarization of the conductive gate 22, cause built in variations in channel length. In this case, transistor cells or regions of cells with shorter gates will experience a more pronounced increase in current with increasing drain voltage. This compromises the safe operating region of the device because the short channel effects can cause or exacerbate current crowding (where locally increased current density leads to locally increased temperature which in turn can lead to further increase in local current density) depending on the region of operation. For example, a trench-gate device with a low applied gate-source voltage, typically less than about 3 volts, as used in current regulation, usually has a negative temperature coefficient of resistance and may therefore be prone to current crowding.

An object of the present invention is to provide a vertical power transistor semiconductor device which has a structure different from the known DMOS and trench-gate structures discussed above and which has an improved combination of the properties discussed above compared with either of the known DMOS and trench-gate structures.

According to the present invention, there is provided an insulated gate power transistor semiconductor device comprising a semiconductor body having an active area with a plurality of electrically parallel transistor cells, wherein each transistor cell has a source region and a drain region of a first conductivity type which are separated by a channel-accommodating body region adjacent an insulated gate structure, said peripheral gate structure comprising first and second gates isolated from each other so as to be independently operable, the first gate being an insulated trench-gate adjacent the body region enabling a first, vertical, channel portion to be formed in said body portion when gate potential is applied to the first gate, the second gate having at least an insulated planar gate portion on a top major surface of the semiconductor body adjacent the body region enabling a second, at least partly lateral, channel portion to be formed in said body portion when gate potential is applied to the second gate, such that simultaneous operation of the first and second gates combines the first and second channel portions to form a conduction channel between the source and drain regions.

First and second examples of a device structure within the scope of claim 1 are respectively defined in claims 2 and 3.

It is acknowledged that U.S. Pat. No. 6,303,410B1 (Baliga) discloses a method of making a power semiconductor device including a T-shaped gate electrode which has a vertical portion extending in a trench below a semiconductor substrate top surface and lateral portions extending above that top surface. In a first embodiment the drain drift region extends to the top surface between the channel-accommodating p-base region and the trench. In a second embodiment the p-base region extends to the vertical side of the trench such that in operation a continuous conduction channel is formed having a lateral portion under the lateral portion of the gate and a vertical portion adjacent the vertical portion of the gate. The method and the resulting gate structure are intended to overcome prior art problems concerning methods of planarising the top surface of trench gate electrodes. The gate structure disclosed is a single gate, and not an at least partly planar gate and a trench gate which are isolated from each other as in the device structure of the present invention.

The device as defined above in accordance with the present invention is a dual-gate device which has an on-resistance which is lower than for a DMOS device and which approaches that of a trench-gate device. The dual-gate device according to the present invention also has much lower power losses at turn on and turn off when compared with a DMOS device. The dual-gate device according to the present invention also has improved transfer characteristics for amplification or current regulation when compared with a trench-gate device.

It is acknowledged that dual gate MOSFETs are known per se, however only with two similar active regions with similar, lateral, gates. By contrast, the device in accordance with the present invention has advantages of combining the vertical gate technology of a trench-gate power transistor with the lateral gate technology of a DMOS vertical power transistor as will be explained in more detail below.

Preferred features of the device according to the present invention are defined in claims 2 to 4.

A circuit arrangement according to the present invention which includes a power transistor semiconductor device is defined in claims 5 to 10. In particular, claim 7 defines a preferred circuit arrangement for supplying a regulated voltage to an output, and claims 8 to 10 define preferred circuit arrangements for supplying current to a load.

The present invention will now be described in detail with reference to the accompanying drawings, in which.

Figure 1:
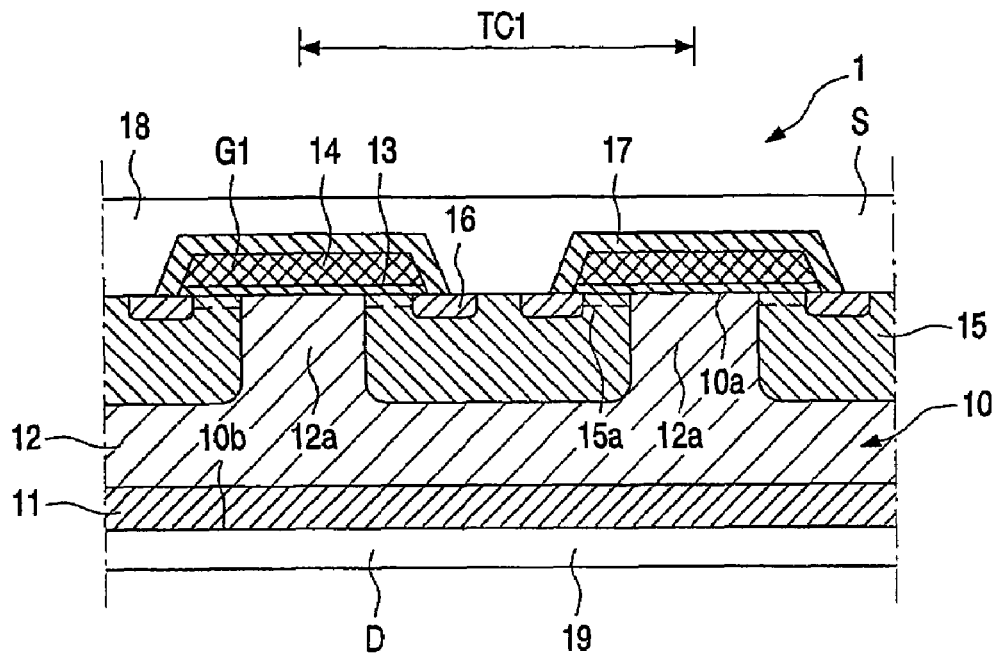
FIG. 1 shows a cross-section view of a known DMOS vertical power transistor device as has been described above.
Figure 2:
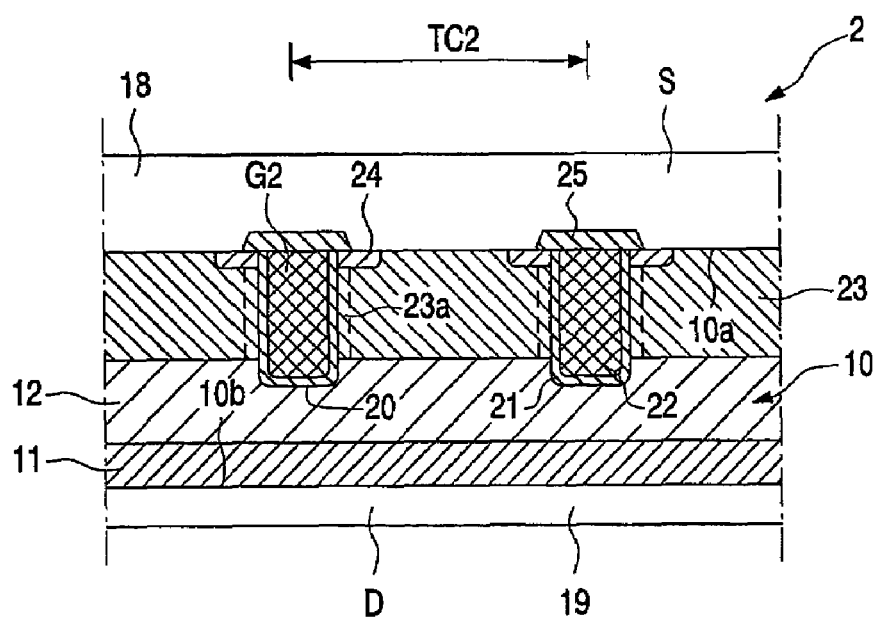
FIG. 2 shows a cross-section view of a known trench-gate vertical power transistor device as has been described above.
Figure 3:
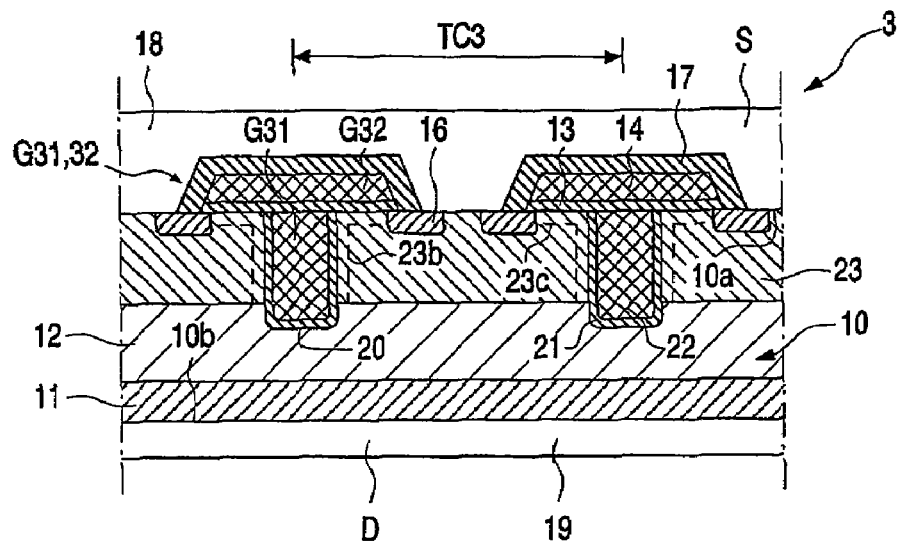
Figure 4:
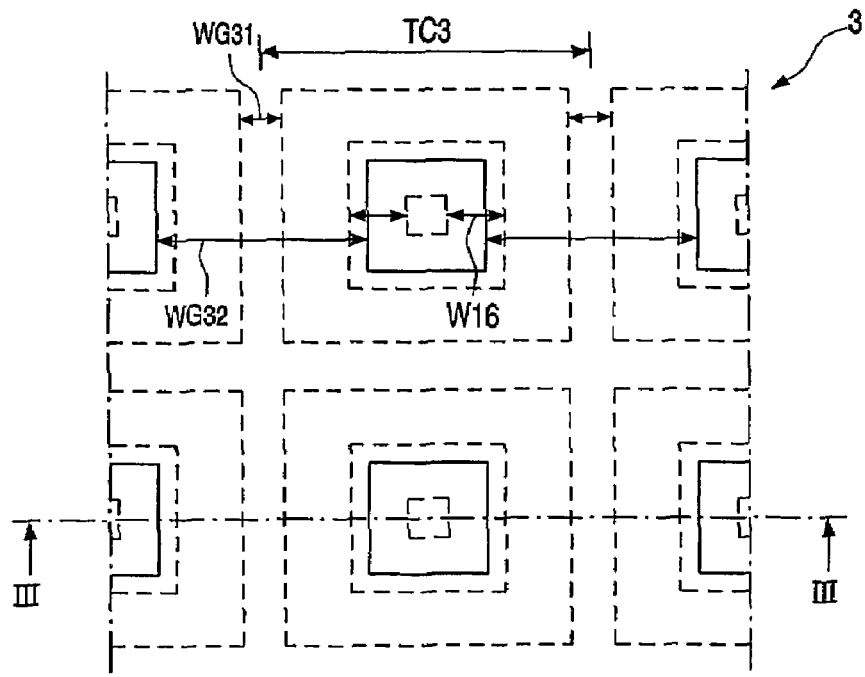
Figure 7:
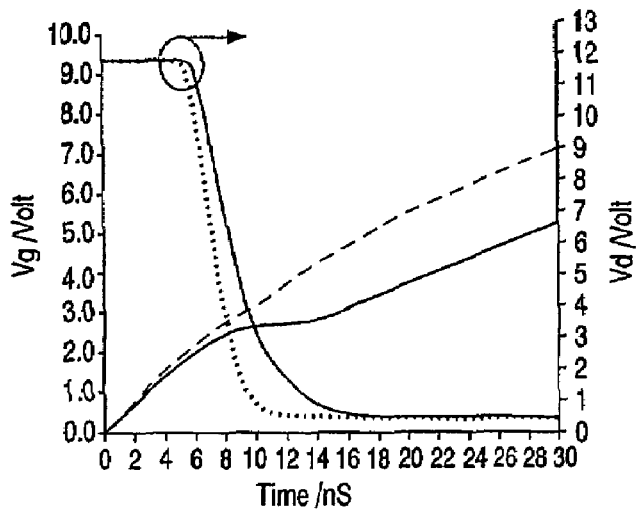
Figure 8:
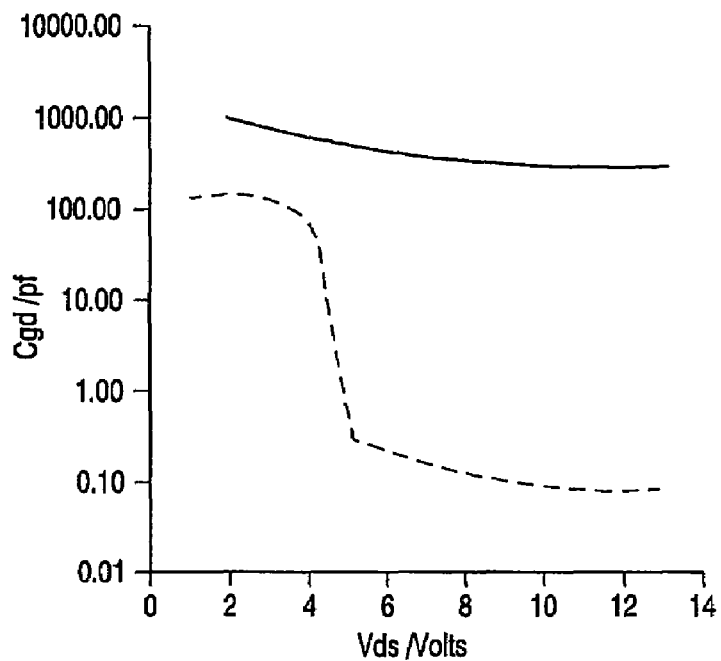
Figure 9:
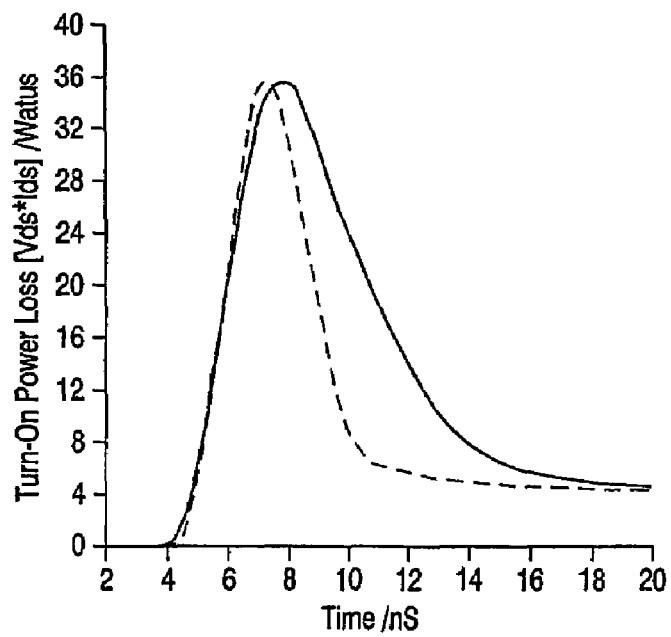
Figure 10:
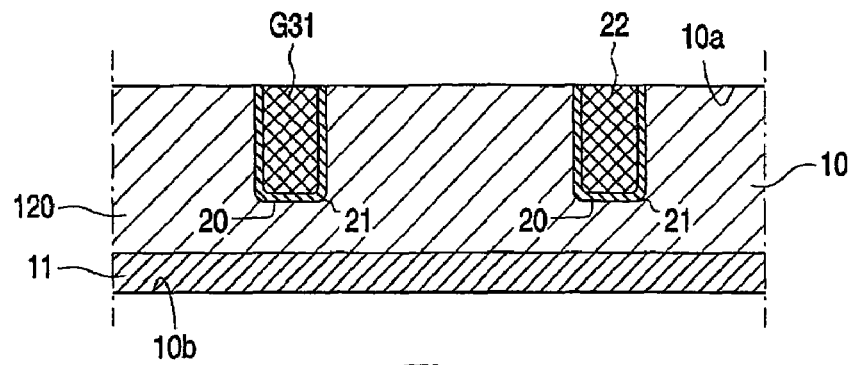
Figure 11:
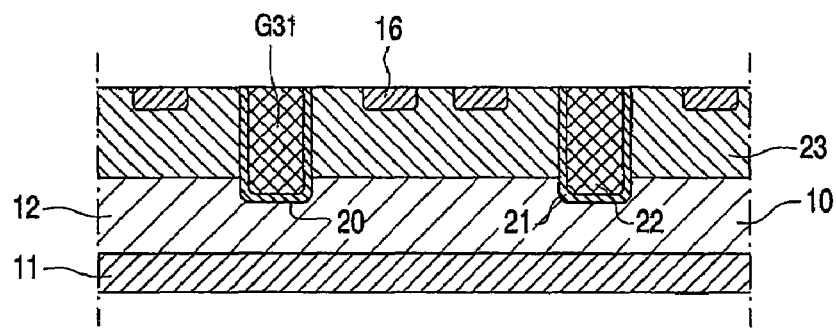
Figure 12:
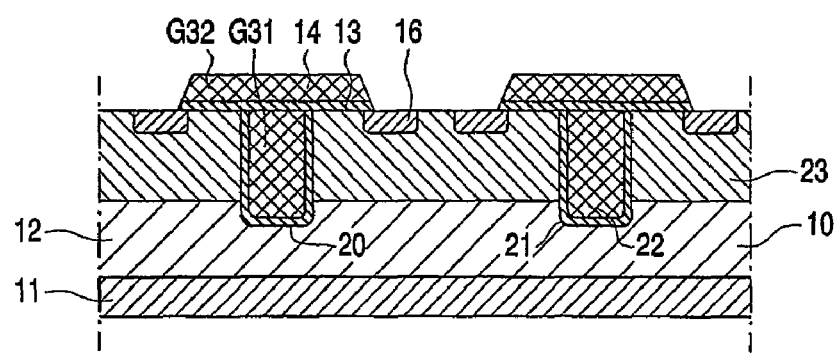
Figure 13:
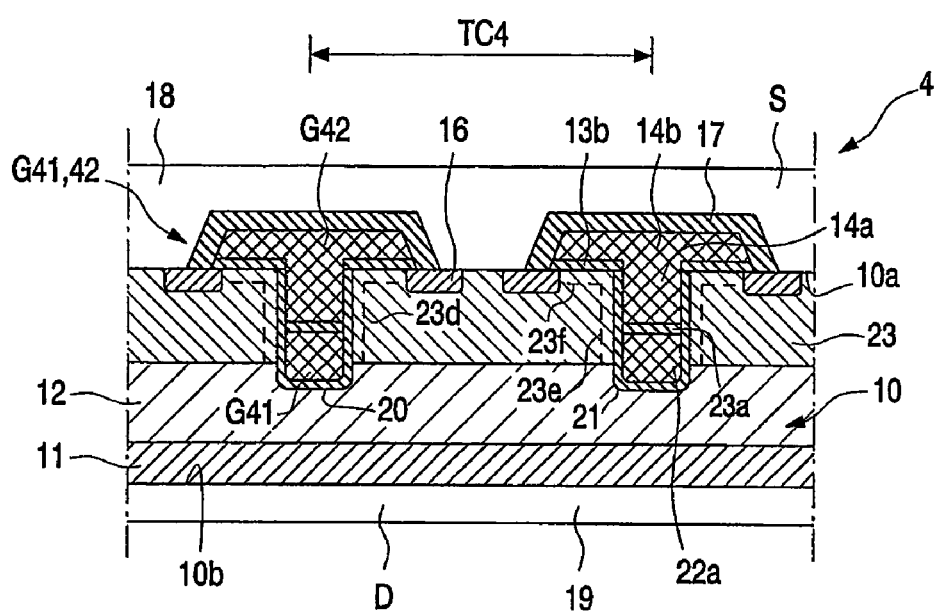
Figure 14:
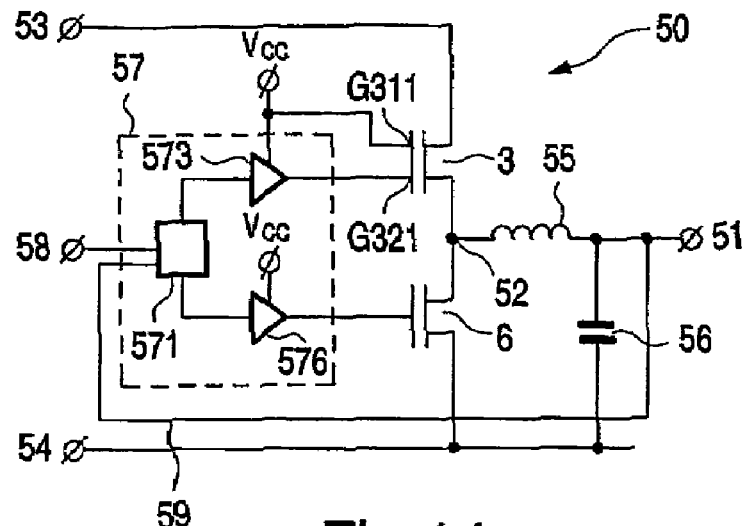
Figure 15:
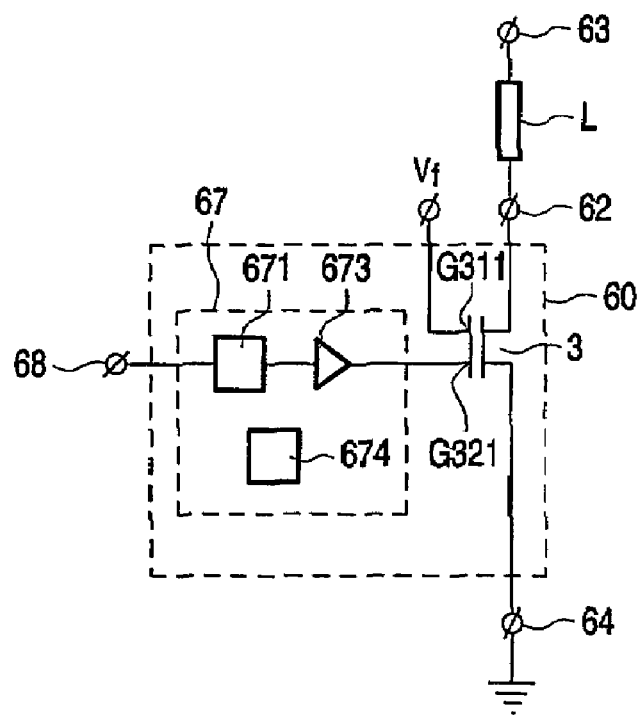

FIGS. 3 and 4 respectively show a cross-section view and a plan view of a first example of a dual gate vertical power transistor device according to the present invention, the cross-section of FIG. 3 being along the line III-III of FIG. 4;

FIGS. 5, 6, 7, 8, and 9 show the simulated performance of a device having the structure according to FIG. 3 compared with a known DMOS device having the structure according to FIG. 1 respectively demonstrating on-state resistance (FIG. 5), turn-on switching speed (FIG. 7), 'Miller' feedback capacitance Cgd (FIG. 8), and turn-on switching power loss (FIG. 9);

FIGS. 10, 11 and 12 show cross-sectional views of part of a semiconductor body to illustrate steps in one method of manufacturing a device as shown in FIGS. 3 and 4;

FIG. 13 shows a cross-section view of a second example of a dual gate vertical power transistor device according to the present invention;

FIG. 14 shows a voltage regulation module circuit arrangement including a dual-gate device, having the structure of FIG. 3, connected as a high side power transistor in series with a low side power transistor via a switch node; and FIG. 15 shows a circuit arrangement including a dual-gate device, having the structure of FIG. 3, connected as a low side switch for supplying current to a load and including a protection circuit.

It should be noted that FIGS. 1 to 4, FIGS. 10 to 12, and FIG. 13 are diagrammatic and not drawn to scale. Relative dimensions and proportions of these Figures have been shown exaggerated or reduced in size, for the sake of clarity and convenience in the Drawings.

Referring now to FIGS. 3 and 4, there is shown a first example of a vertical insulated gate field effect power transistor semiconductor device 3 in accordance with the invention. The device 3 comprises a monocrystalline silicon semiconductor body 10 having a top major surface 10a opposed to a bottom major surface 10b. The semiconductor body 10 comprises a relatively highly doped substrate 11 of a first conductivity type, n+ conductivity type in this example, which forms the drain region of the device 3. A relatively lowly doped semiconductor region 12 of the first conductivity type, n− conductivity type in this example, forms a drain drift region of the device 3. A region 23 which is of a second, opposite, conductivity type, p conductivity in this example, extends between the top surface 10a and the drain drift region 12 and provides a channel-accommodating body region 23.

The device 3 has an active area with a large number of electrically parallel transistor cells sharing the common drain region 11. FIG. 3 shows the lateral extent, that is the cell pitch, of one complete transistor cell TC3 and part of an adjacent transistor cell at either side of the cell TC3. Two sections are shown of a peripheral insulated gate structure G31,32 located at the boundary between each two adjacent transistor cells. The peripheral gate structure G31,32 comprises a first gate G31 and a second gate G32 isolated from each other so as to be independently operable. At the cell boundary a trench 20 extends vertically through the body region 23 into the drain drift region 12, has an insulation layer 21 at the vertical and bottom walls of the trench 20, and has gate conductive material 22, for example doped polycrystalline silicon, in the trench 20 within the layer 21 to form an insulated trench-gate first gate G31 for the two transistor cells which are adjacent the cell boundary. This first gate G31, which is adjacent the body region 23 and the drain drift region 12 within the adjacent transistor cells such as the cell TC3, enables a first, vertical, channel portion 23b to be formed in the body portion 23 when gate potential is applied to the first gate G31. Also at the cell boundary, a planar insulation layer 13 on the top major surface 10a with gate conductive material 14, for example doped polycrystalline silicon, thereon is located on top of the trench 20 and extends laterally both ways beyond the trench 20 so as to form an insulated substantially completely lateral planar second gate G32 for each of the two transistor cells which are adjacent the cell boundary. The meaning of "substantially completely lateral" herein will be explained later with reference to FIGS. 10 to 12 which illustrate steps in a method of manufacturing the device 3. The planar insulation layer 13, where it is immediately above the trench 20, also isolates the first and second gates G31 and G32 from each other for the two transistor cells. The second gate G32 enables a second, lateral, channel portion 23c to be formed in the body portion 23 when gate potential is applied to the second gate G32. A source region 16 of the first conductivity type (n+ conductivity type in this example) is provided in each transistor cell under the top major surface 10a adjacent the second gate G32 and spaced from the first gate G31. Simultaneous operation of the first and second gates G31 and G32 combines the first and second channel portions 23b and 23c to form a conduction channel through which current flows in each transistor cell laterally and then vertically between the source region 16 and the separating body region 23 to the drain drift region 12 in the on-state of the device 3. In suitable circuit applications of the device 3, which will be described later, it is suitable to have a fixed gate potential connected to the first gate G31, and a modulating gate potential connected to the second gate G32. The separation of the source region 16 from the trench-gate first gate G31 ensures that there is no current flow due to the biasing fixed potential applied alone to the first gate G31, and thus the modulating potential applied to the second gate G32 is effective to switch the device 3 on, or partially on, and off.

The transistor cells in the active area of the device 3 can have a closed cell geometry, for example square cells as shown in FIG. 4, in which annular peripheral gate structures G31,32 surround each transistor cell in a two-dimensionally repetitive pattern. FIG. 4 shows the lateral extent of the transistor cells, that is the cell pitch TC3, the width WG31 of the peripheral annular first gates G31, the width WG32 of the peripheral annular second gates G32 and the width W16 of the annular source regions 16 within each transistor cell.

The transistor cells as shown in cross-section in FIG. 3 could be closed cells with annular hexagonal shaped or stripe shaped peripheral gate structures G31,32. FIG. 3 could also be a cross-section of an open-cell geometry having a one-dimensionally repetitive pattern in which the peripheral gate structures G31,32 are parallel stripes which each extend across the active area of the device 3.

An insulating region 17 is provided over the second insulated gate G32. Source metallization 18 contacting all of the source regions 16 is provided on the first major surface 10a over the insulating region 17 to provide a source electrode S. Although not shown, electrical connection to the second insulated gate G32 is provided by formation of one or more windows through the insulating region 17 to expose part of the gate conductive layer 14 and patterning of the source metallization to provide a separate gate electrode. Also, although not shown, electrical connection to the first insulated gate G31 is provided by extending the insulating layer 21 from the trenches 20 on to the top surface 10a of the semiconductor body 10 in an inactive area outside the active transistor cell area and extending the gate material 22 on to this top surface insulating layer where it is contacted by metallization to provide a gate electrode. A metallization layer 19 forms an ohmic contact with the drain region 11 so as to provide a drain electrode D.

FIGS. 5 to 9 show the simulated performance of a device having the structure according to FIG. 3 compared with that of a known and commercially available DMOS device having the structure according to FIG. 1. In each of these Figures the performance of the FIG. 3 device is shown by the dotted line curve and that of the DMOS device by the full line curve. The cell pitch for the simulated FIG. 3 device is 4 μm which approaches that of a typical trench-gate device, and the cell pitch of the DMOS device is 7 μm. For illustration, the cell pitch TC3 of the FIG. 3 device is shown to be a little more than the cell pitch TC2 of the known trench-gate device of FIG. 2 and less than the cell pitch TC1 of the known DMOS device of FIG. 1.

Figure 5:
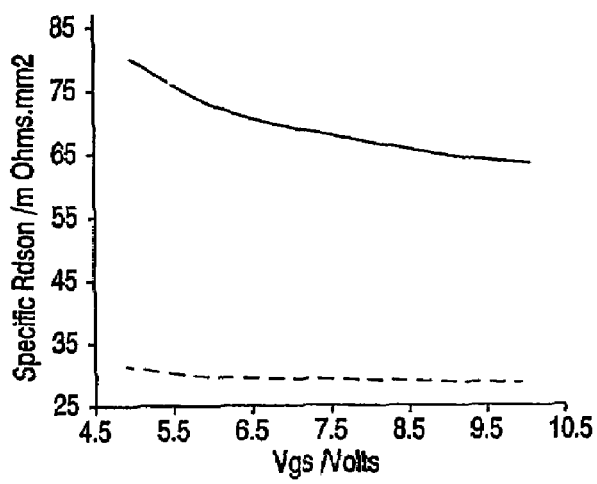
Figure 6:
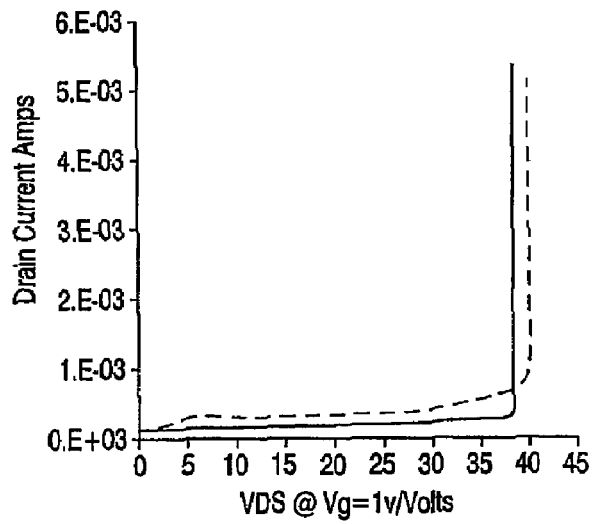

FIG. 5 shows the specific on-state resistance Rdson/mOhms·mm$^2$ as a function of gate voltage Vgs/Volts, and shows that the specific on-state resistance of the FIG. 3 device is approximately 40% that of the DMOS device and approaches that of a typical trench-gate device. FIG. 6 shows the drain current/Amps as a function of drain voltage Vds @ Vg=1v/Volts, and shows that there is no loss of breakdown voltage (40 volts) for the FIG. 3 device compared with the DMOS device.

For a comparison of the turn-on switching performance of the two devices, as is shown in FIGS. 7, 8 and 9, the cell active area for the devices has been set with that of the FIG. 3 device less than that of the DMOS device so that they both have the same on-state resistance of 9 mOhms at Vgs=7 volts.

For the switching simulations shown in FIGS. 7, 8 and 9 a fixed gate potential, that is a permanent bias, of 12 volts was applied to the trench-gate first gate G31 of the FIG. 3 device and this device was then turn on by gate potential Vg additionally applied to the planar second gate G32.

FIG. 7 shows the gate voltage Vg/Volts and fall of the drain voltage Vds as a function of time for turn-on of the FIG. 3 and DMOS devices having the same on-state resistance. It can be seen that the FIG. 3 device exhibits a much higher dV/dt and no change in the fall of Vds as the voltage passes the gate plateau period compared with the DMOS device.

FIG. 8 shows the gate-drain capacitance, that is the 'Miller' feedback capacitance, Cgd/pf as a function of drain voltage Vds/Volts for the two devices. This shows a substantial decrease in gate-drain capacitance for the FIG. 3 device compared with the DMOS device. For a drain voltage of 12 volts Cgd for the FIG. 3 device is near zero and more than 3 orders of magnitude lower than that of the DMOS device. The gate-drain charge Qgd of the FIG. 3 device associated with Cgd is also near zero at approximately 1 nC. Near zero Cgd and Qgd result from the trench-gate first gate G31, which extends into the drain drift region, 12 completely shielding the gate conductive material 14 of the planar second gate G32 which reduces the gate-drain periphery of this second gate G32 to zero. The FIG. 3 device used in these simulations has a figure of merit (Rdson×Qgd) of approximately 9 mOhms·nC.

FIG. 9 shows the turn-on power loss [Vds×Ids]/Watts against time for the two devices. Comparing FIG. 9 with FIG. 7 shows that the majority of these losses for both devices occur during the fall of Vds before the drain voltage reaches the gate plateau period. However the overall turn-on switching loss for the FIG. 3 device is only approximately 60 percent of that for the DMOS device. The same reduction in overall switching loss applies to turn-off.

As stated above with reference to FIG. 5, the specific on-state resistance of the FIG. 3 device approaches that of a typical trench-gate device. It has been explained in the introductory discussion that the switching performance of the known DMOS device shown in FIG. 1 is better than that of the known trench-gate shown in FIG. 2. Thus it can be expected that the improvement in switching performance of the FIG. 3 device compared with the trench gate device of FIG. 2 would be even greater than the improvement in switching performance of the FIG. 3 device compared with the DMOS device of FIG. 1 which is shown in the simulations of FIGS. 7,8 and 9.

The switching performance of the device 3 as described above with reference to FIGS. 5 to 9 is particularly important if the transistor device is to be used as a very high frequency switching device, for example as the high side control FET in a voltage regulation circuit arrangement as will be described later with reference to FIG. 14. However, as indicated in the introductory discussion, if the transistor device is to be used to supply and regulate current to a load, for example in a circuit arrangement as will be described later with reference to FIG. 15, then the performance during the partially turned on state such as the safe operating area of the transistor device assumes greater importance and the partially turned on state performance of the device 3 will be discussed in the following.

It is known to improve the current limiting or current controlling mode of operation of a single field effect transistor common source amplifier by employing a cascode arrangement of two discrete field effect transistors. In such an arrangement one transistor, the cascode transistor, has its drain connected to the load, its gate connected to a fixed potential and its source connected to the drain of the other transistor, the common source amplifier transistor, whose gate is used to control the current through both transistors. Key benefits of the cascode arrangement include improved linearity, stability and isolation of the controlling gate from the load impedances. Such cascode arrangements do not require a terminal connection to the intermediate connected source and drain electrodes, and it is known to use a dual gate field effect transistor in place of a cascode arrangement of two discrete transistors. As has been stated in the introductory discussion, such dual gate transistors (MOSFETs) have been implemented with two similar active regions with similar, lateral, gates.

If the dual gate device 3 as described with reference to FIG. 3 is used as a cascode arrangement to supply current to a load as it is in the circuit arrangement to be described with reference to FIG. 15, then it performs, in particular having regard to safe operating area, better than two cascoded discrete DMOS devices or an equivalent dual gate DMOS device; better than two cascoded discrete trench-gate devices or an equivalent dual gate trench-gate device; and also better than a cascode arrangement of a discrete DMOS device with a discrete trench-gate device. In the device 3, the channel shortening of the vertical trench-gate channel 23b, in response to increased drain voltage, does not significantly affect the output current because this is now regulated by the integrated DMOS device, in which the channel length of the lateral planar gate channel 23c is not affected by drain potential and does not suffer local variations due to trench etch or gate planarization. These benefits apply on a per transistor cell basis, as each trench-gate transistor cell portion is modulated by its own DMOS transistor cell portion. Sharing down to the level of individual transistor cells, and even along the periphery of each transistor cell, is much improved when the device 3 is used as a cascode arrangement, as compared to using two discrete devices where the common source amplifier device only regulates the total current in the cascode device and does not affect its internal distribution of current.

FIGS. 10 to 12 show cross-sectional views of part of a semiconductor body to illustrate steps in one method of manufacturing a device 3 as shown in FIGS. 3 and 4. Initially a monocrystalline silicon semiconductor body 10 is provided consisting of an n+ conductivity type substrate for forming the drain region 11. An n− conductivity type epitaxial layer 120 is grown on the substrate 11 for forming the drain drift region 12. The top surface of the layer 120 forms the top major surface 10a of the device to be formed and the bottom surface of the layer 11 forms the bottom major surface 10b of the device to be formed. A masking layer (not shown), for example silicon dioxide or silicon nitride, is provided on the top surface 10a and patterned using photolithographic techniques to define windows therein. Anisotropic etching through these mask windows is carried out to define the trenches 20, and the mask is then removed. The silicon body 10 is then subjected to thermal oxidation treatment to form a thin silicon dioxide layer in the trenches 20 which provides the gate insulation layer 21 at the vertical and bottom walls of the trenches 20 and this silicon dioxide is then removed from the top surface 10a. Doped polycrystalline silicon is then deposited to fill the insulated trenches 20, 21 and provide the gate conductive material 22 and is then planarised by etching back to the top surface 10a so that the insulated trenches 20, 21 with gate conductive material 22 form the insulated trench-gate first gates G31 as shown in FIG. 10.

Acceptor dopant ions are then implanted and a heating step diffuses the implanted dopant to the desired depth to form the p-type body region 23. A photolithographic mask (not shown) is then provided with windows on the top major surface 10am, donor dopant ions are then implanted through these windows and diffusion by heating forms the n+ conductivity type source regions 16 as shown in FIG. 11, and the mask is removed.

An insulation layer of silicon dioxide is then thermally grown on the top major surface 10a and a doped polycrystalline silicon layer is deposited on to this insulation layer. These two layers are then patterned using photolithography and etching to define the insulated lateral planar second gates G32 each having the planar insulation layer 13 and the gate conductive material 14 on top of and extending laterally beyond the trenches 20 as shown in FIG. 12.

The structure of the active area of the device 3 is then completed by forming an insulation layer over the surface structure shown in FIG. 12, then patterning by masking and etching to provide the insulating regions 17 of the device as shown in FIG. 3, and then forming source, gate and drain electrodes as has already been described with reference to FIG. 3.

In relation to the above described method of manufacturing the device 3, it is to be noted that the step of etching back the gate conductive material 22 may not result in precise planarization to the top surface 10a as shown in FIG. 10. In practice occasional over planarization, that is with the gate conductive material being etched to slightly below the top surface 10a, is more likely than and preferable to occasional under planarization and therefore in practice it can be best to aim for a small level of over planarization. A small deviation from precise planarization for the reasons just discussed will result in the insulation layer 13 not being precisely planar and hence the insulated second gate G32 not being precisely completely lateral, but nevertheless being "substantially completely lateral", and this is what is meant by this phrase in the above description of the device 3 with reference to FIGS. 3 and 4.

Referring now to FIG. 13, there is shown a second example of a vertical insulated gate field effect power transistor semiconductor device 4 in accordance With the invention. The device 4 is a modification of the device 3 shown in and described with reference to FIGS. 3 and 4 above and in the following, only the modifications in the device 4 with respect to the device 3 will be described.

In the device 4, a peripheral gate structure G41,42 located at the boundary between each two adjacent transistor cells TC4 comprises a first gate G41 and a second gate G42 isolated from each other so as to be independently operable. The insulated trench 20 has gate material 22a in a lower portion of the trench 20 providing the first gate G41 for the two adjacent transistor cells which enables a vertical channel portion 23d to be formed when gate potential is applied to the first gate G41. A first insulation layer 13a is located laterally within and across the trench 20 with gate material 14a thereon in an upper part of the trench 20, and a second insulation layer 13b with gate material 14b thereon extends laterally both ways from the trench 20 on the top major surface 10a of the semiconductor body 10. Thus the second gate G42 for each of the two adjacent transistor cells has an insulated trench-gate portion which enables a vertical channel portion 23e to be formed, and an insulated planar gate portion which enables a lateral channel portion 23f to be formed, when gate potential is applied to the second gate G42. The first insulation layer 13a laterally within and across the trench 20 isolates the first and second gates G41, G42 from each other for each two adjacent transistor cells. Simultaneous operation of the first and second gates G41 and G42 combines the channel portions 23f, 23e and 23d to form a conduction channel through which current flows in each transistor cell laterally and then vertically between the source regions 16 and the separating body region 23 to the drain drift region 12 in the on-state of the device 4.

A device 4 as shown in FIG. 13 may be manufactured by a modified version of the method described above with reference to FIGS. 10 to 12 for the device 3 shown in FIGS. 3 and 4. The modification is that after the structure is formed as shown in FIG. 11 the gate material 22 is etched back to leave the lower portion 22a as shown in FIG. 13, then thermal growth of silicon dioxide forms the insulation layers 13a and 13b, and then deposition of doped polycrystalline silicon provides gate material for the upper trench gate portion 14a and for the lateral gate portion 14b which is above the top major surface 10a of the semiconductor body 10. In this case the etch back of the gate material 22 is a deliberate over planarization to the extent that the second gate G42 will certainly have an insulated trench-gate portion which will have approximately a predetermined required length.

Relative merits of the device 4 shown in FIG. 13 compared with the device 3 shown in FIGS. 3 and 4 are indicated as follows. For applications where a fixed potential is applied to the first gate, G31 in device 3 and G41 in device 4, for example in the circuit arrangements to be described with reference to FIGS. 14 and 15, the first gate G31, G41 must be a certain distance from the source 16 to avoid merging of the depletion regions from the source and the first gate G31, G41. For the device 3 this minimum distance is provided wholly laterally, whereas for the device 4 this minimum distance is provided partly laterally and partly vertically. Thus it is possible, for the device 4, to reduce the lateral distance of the source 16 from the trench 20 and hence reduce the transistor cell pitch with a consequent lower on-state resistance for a given size of the device. On the other hand, the likely variation from transistor cell to cell of the depth of the trench-gate first gate G41 in the device 4, due to planarization variation, may reduce the benefits of transistor cell current sharing with respect to the safe operating area compared with the device 3.

Referring now to FIG. 14, there is shown a voltage regulation module (VRM) circuit arrangement 50 including a dual-gate power transistor 3, having the structure of FIG. 3, connected as a high side power transistor in series with a low side power transistor 6 for supplying a regulated voltage to an output 51 via a switch node connection 52 between the transistors 3 and 6.

The circuit 50 may be, for example, a synchronous dc-dc buck converter used to convert an input voltage supply (e.g. 12V) to a lower output voltage supply (e.g. 5V). The input voltage is applied between an input line voltage terminal 53 and a ground terminal 54. The high side transistor 3 is connected to the input terminal 53 and is known as the control FET. The low side transistor 6 is connected to the ground terminal 54 and is known as the synchronous (sync) FET. The switch node connection 52 feeds through an inductor 55 and across a capacitor 55 to the output line voltage terminal 51.

A control circuit 57 has a control portion 571 with one input on a control terminal 58 and another input fed from the output 51 via a feedback path 59. The control portion 571 supplies control signals to a gate driver circuit 573 for the high side transistor 3 and to a gate driver circuit 576 for the low side transistor 6. These control signals are alternating signals which cause the control and sync FETs 3,6 to conduct alternately. The mark-space ratio, i.e. the ratio of the time for which the control FET 3 conducts to the time the sync FET 6 conducts, is varied to achieve the desired voltage on the output 51.

The first gates G31 of the cells of the transistor 3 are connected to a first gate electrode G311 which is connected to terminal means Vcc for connecting a supplied fixed gate potential to the gate electrode G311. As shown in FIG. 14, the terminal Vcc to which the gate electrode G311 is connected is the terminal which supplies a 12V line voltage to the gate driver circuit 573. Alternatively the gate electrode G311 could be connected to the 12V input line voltage terminal 53 or to the 5V output line voltage terminal 51. The second gates G32 of the cells of the transistor 3 are connected to a second gate electrode G321 which is connected to the gate driver circuit 573 for applying a modulating potential to the gate electrode G312.

In the circuit arrangement of FIG. 14, the dual gate power transistor 3 may be substituted by the dual gate power transistor 4 described above with reference to FIG. 13, bearing in mind the relative merits of these two devices as discussed above. The dual gate power transistor 3 or 4 is particularly advantageous for use as the high side control FET because low switching losses are paramount for this transistor. Low switching losses are less important for the low side sync FET 6 for which a low on-state resistance Rds-on is paramount. A trench-gate MOSFET power transistor, as is described above with reference to FIG. 2 is therefore preferable for us as the sync FET 6.

Referring now to FIG. 15 there is shown a circuit arrangement 60 including a dual-gate power transistor 3, having the structure of FIG. 3, connected as a low side power transistor in series with a load L between a voltage supply line terminal 63 and a ground terminal 64. That is the power transistor 3 is a switch for supplying current to the load L when its drain electrode is connected to the load L via the terminal 62 of the circuit 60. A control circuit 67 has a control portion 671 connected to a control input terminal 68. The control portion 671 supplies control signals to a gate driver circuit 673 for the transistor 3.

The first gates G31 of the cells of the transistor 3 are connected to a first gate electrode G311 which is connected to terminal means $V_F$ for connecting a supplied fixed gate potential to the gate electrode G311. The second gates G32 of the cells of the transistor 3 are connected to a second gate electrode G321 which is connected to the gate driver circuit 673 for applying a modulating potential to the gate electrode G312.

The control circuit 67 includes protection circuit means 674 for the power transistor switch 3. The protection circuit means 674 is not shown connected in FIG. 15, since its connections to the other circuit elements shown within the circuit arrangement 60 depend on whether it is adapted and arranged for one or more of the functions of voltage overload protection, current overload protection and temperature overload protection. The control circuit 67 may be integrated with the power transistor switch 3 in a circuit area of the same semiconductor body provided for the power transistor switch 3 between the active power transistor cell area and a peripheral termination scheme area. The circuit elements of the control circuit 67 may be fabricated with their own layout in this circuit area using some of the same masking and doping steps as are used in the manufacture of the transistor cells.

In the circuit arrangement of FIG. 15, the dual gate power transistor 3 may be substituted by the dual gate power transistor 4 described above with reference to FIG. 13, bearing in mind the relative merits of these two devices as discussed above. Protection of the power transistor switch 3 or 4 against overloads may be partly facilitated by operating in a current limiting mode, and in this case the improved linearity, stability, and isolation of the controlling (modulating) gate electrode G321 from impedances of the load L which are the key benefits of a cascode arrangement are achieved by the equivalent dual gate transistor 3 or 4. Also, the improved sharing (uniformity of current density) and safe operating area of the dual gate power transistor 3 or 4 allows improvements in the levels of protection which can be realized with the protection circuit means 674 when integrated in the control circuit 67 and with the power transistor 3 or 4. The load L shown in FIG. 15 may be, for example, a lamp, motor, solenoid or heater in an automotive electrical system. In such a system the voltage supply to the line terminal 63 is conventionally a nominal 12 volts or 24 volts. Under consideration are such systems in which this voltage supply is 42 volts. In a 42 volts system short channel effects and safe operating area of the power transistor switch become more critical while on-state resistance has a slightly lower priority, so that the dual gate power transistor 3 or 4 is particularly advantageous for use in such a system.

The circuit arrangements described above with reference to FIGS. 14 and 15 show the first (trench-gate) gate G311 of the device 3 connected for application of a fixed potential and the second (planar) gate G321 of the device 3 (or the second part planar, part trench-gate, gate G42 if substituted by the device 4) connected for application of a switching (modulating) potential. It is envisaged that the devices 3 and 4 can be used in other circuit arrangements where the first (G31, G41) and second (G32, G42) gates are still arranged for connection via their respective electrodes to respective independent applied control potentials. For example, the second gates G32, G42 could be used to modulate or limit the output of the device retaining full cascode benefits while the first gates G31, G41 are used for on-off control.

Possible modifications of the device 3 described with reference to FIGS. 3 and 4, and of the device 4 described with reference to FIG. 13, within the scope of the present invention include the following. The devices 3 and 4 have been described and shown as MOSFET devices. However, with appropriate known modifications to the device structure below the drain drift region 12, the devices 3 and 4 may instead be provided as insulated gate bipolar transistors (IG-BTs) which may furthermore be used as the devices 3 or 4 in the circuit arrangements described with reference to FIGS. 14 and 15.

Although not shown, the devices 3 and 4 may incorporate within each transistor cell a deep localized "ruggedness" region of the same conductivity type as the channel-accommodating body region 23.

In the devices 3 and 4 as described above the source regions 16 are semiconductor regions. However, the source regions could be provided by Schottky metallization such as silicide, for example platinum silicide, forming a Schottky barrier with the body regions 23.

The conductivity types described for the devices 3 and 4 may be reversed. That is to say that the source and drain regions 16,12,11 may be of p conductivity type with the body regions 23 being on n conductivity type. Semiconductor materials other than silicon may be used such as germanium or germanium silicon alloys, or silicon carbide, for example.

Furthermore, a device may be manufactured in accordance with the invention of the p-channel type, having p-type source and drain regions, and a p-type channel-accommodating body region. It may also have an n-type deep localized region within each cell. N-type polycrystalline silicon may be used for the gates. In operation, a hole accumulation channel is induced in the channel-accommodating body region by the gates in the on-state. The low-doped p-type drain drift region may be wholly depleted in the off-state, by depletion layers from the insulated gates and from the deep n-type region.

A discrete device has been illustrated with reference to FIGS. 3 and 13, having its drain electrode 19 contacting the region 11 at the back surface 10*b* of the body 10. However, an integrated device is also possible in accordance with the invention. In this case, the region 11 may be a doped buried layer between a device substrate and the epitaxial low-doped drain region 12. This buried layer region 11 may be contacted by an electrode at the front major surface 10*a*, via a doped peripheral contact region which extends form the surface 10*a* to the depth of the buried layer.

From reading the present disclosure, other variations and modifications will be apparent to persons skilled in the art. Such variations and modifications may involve equivalent and other features which are already known in the art, and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new claims may be formulated to such features and/or combinations of such features during the prosecution of the present Application or of any further Application derived therefrom.

The invention claimed is:

1. An insulated gate power transistor semiconductor device comprising a semiconductor body having an active area with a plurality of electrically parallel transistor cells, wherein each transistor cell has a source region and a drain region of a first conductivity type which are separated by a channel-accommodating body region adjacent an insulated gate structure, said gate structure comprising first and second gates isolated from each other so as to be independently operable, the first gate being an insulated trench-gate adjacent the body region enabling a first, vertical, channel portion to be formed in said body region when gate potential is applied to the first gate, the second gate having at least an insulated planar gate portion that is located above the first gate on a top major surface of the semiconductor body adjacent the body region, the second gate enabling a second, at least partly lateral, channel portion to be formed in said body portion when gate potential is applied to the second gate, such that simultaneous operation of the first and second gates combines the first and second channel portions to form a conduction channel between the source and drain regions.

2. A semiconductor device as claimed in claim 1, wherein a said gate structure is located at the boundary between each two adjacent transistor cells, wherein at said boundary, an insulated trench having gate material therein forms said first gate for the two transistor cells, and a planar insulation layer with gate material thereon is located on top of the trench and extends laterally both ways beyond the trench, such that said second gate for the two transistor cells is an insulated substantially completely planar gate, and such that the planar insulation layer also isolates the first and second gates from each other for the two transistor cells.

3. A semiconductor device as claimed in claim 1, wherein a said gate structure is located at the boundary between each two adjacent transistor cells, wherein at said boundary, an insulated trench having gate material in a lower portion of the trench provides said first gate for the two transistor cells, a first insulation layer is located laterally within and across the trench with gate material thereon in an upper part of the trench, and a second insulation layer with gate material thereon extends laterally both ways from the trench on the top major surface of the semiconductor body, said second gate for the two transistor cells having an insulated trench-gate portion formed from the gate material in the upper part of the trench and the insulated planar gate portion of the second gate being formed from the gate material on the second insulator, and wherein the first insulation layer isolates the first and second gates from each other for the two transistor cells.

4. A semiconductor device as claimed in any one of claims 1 to 3, wherein the transistor cells in the active area have a closed cell geometry in which said peripheral gate structures surround each transistor cell in a two-dimensionally repetitive pattern.

5. A circuit arrangement including a power transistor semiconductor device as claimed in claim 1, wherein the first gates and the second gates of the transistor cells are respectively connected to first and second gate electrodes of the device, and wherein said first and second gate electrodes are arranged for connection to respective independent applied control potentials.

6. A circuit arrangement as claimed in claim 5, wherein a terminal for connecting to a supplied fixed gate potential is connected to the first gate electrode, and wherein a gate driver circuit for applying a modulating gate potential is connected to the second gate electrode.

7. A circuit arrangement as claimed in claim 6, wherein the power transistor semiconductor device is a high side power transistor connected in series with a low side power transistor for supplying a regulated voltage to an output via a switch node connection between the high side and low side transistors, and wherein said gate driver circuit is included in a control circuit for alternately switching the high side and low side transistors on and off.

8. A circuit arrangement as claimed in claim 6, wherein the power transistor semiconductor device is a switch for supplying current to a load when the load is connected to one of a source electrode and a drain electrode of the device.

9. A circuit arrangement as claimed in claim 8, wherein the gate driver circuit is included in a control circuit which is integrated with the power transistor switch in said semiconductor body.

10. A circuit arrangement as claimed in claim 9, wherein the control circuit includes protection circuitry for the power transistor switch.

11. A semiconductor device as claimed in claim 1, wherein the drain regions of the plurality of transistor cells are located on a side of the semiconductor body that is opposite from the top major surface of the semiconductor body.

12. A semiconductor device as claimed in claim 1, wherein the drain regions of the plurality of transistor cells are formed by a common drain region.

13. An insulated gate power transistor semiconductor device comprising a semiconductor body having an active area with electrically parallel first and second transistors, the first and second transistors each having a source region and a drain region of a first conductivity type, the drain regions of the transistors being formed by a common drain region and the source and drain regions of each of the transistors being separated from each other by a channel-accommodating body region that is adjacent an insulated gate structure, the gate structure including first and second gates that are isolated from each other and that are independently operable, the first gate being an insulated trench-gate that enables a first, vertical, channel portion to be formed in the body region when a gate potential is applied to the first gate, the second gate having at least an insulated planar gate portion that enables a second, at least partly lateral, channel portion to be formed in the body region when a gate potential is applied to the second gate, wherein simultaneous operation of the first and second gates combines the first and second channel portions to form a conduction channel between the source and drain regions of at least the first transistor, and wherein the second gate is located on a top surface of the semiconductor body above the first gate.

14. A semiconductor device as claimed in claim 13, wherein the gate structure is located at a boundary between the first and second transistors, and the first gate is formed from an insulated trench having gate material therein that extends to the top surface of the semiconductor body, and wherein the device includes a planar insulation layer with gate material thereon that each extends laterally beyond both sidewalls of the trench on the top surface of the semiconductor body, the second gate being formed from the gate material on the planar insulation layer.

15. A semiconductor device as claimed in claim 1, wherein the gate structure is located at a boundary between the first and second transistors, and wherein the first gate is formed from gate material in a lower portion of an insulated trench, a first insulation layer is located laterally within and across the gate material in the lower portion of the insulated trench, the second gate includes an insulated trench-gate portion formed from gate material on the first insulation layer in an upper portion of the insulated trench, and the insulated planar gate portion of the second gate is located on the top surface of the semiconductor body above the insulated trench.

16. A semiconductor device as claimed in claim 13, wherein the common drain region is located on a side of the semiconductor body that is opposite from the top surface of the semiconductor body.

* * * * *